United States Patent
Kim et al.

(10) Patent No.: US 10,600,856 B2
(45) Date of Patent: Mar. 24, 2020

(54) DISPLAY DEVICE WITH A FLEXIBLE SUBSTRATE

(71) Applicant: LG Display Co., Ltd., Seoul (KR)

(72) Inventors: Eunah Kim, Chungcheongnam-do (KR); Sangcheon Youn, Seoul (KR); Saemleenuri Lee, Seoul (KR); Mireum Lee, Gyeongsangnam-do (KR)

(73) Assignee: LG Display Co., Ltd., Seoul (KR)

( * ) Notice: Subject to any disclaimer, the term of this patent is extended or adjusted under 35 U.S.C. 154(b) by 40 days.

(21) Appl. No.: 15/724,571

(22) Filed: Oct. 4, 2017

(65) Prior Publication Data

US 2018/0151655 A1    May 31, 2018

(30) Foreign Application Priority Data

Nov. 30, 2016   (KR) ........................ 10-2016-0161543

(51) Int. Cl.
*H01L 29/08* (2006.01)
*H01L 27/32* (2006.01)
*H01L 27/12* (2006.01)
*H01L 51/00* (2006.01)
*H01L 51/52* (2006.01)

(52) U.S. Cl.
CPC ...... *H01L 27/3262* (2013.01); *H01L 27/1218* (2013.01); *H01L 27/1266* (2013.01); *H01L 27/3253* (2013.01); *H01L 27/3258* (2013.01); *H01L 51/0097* (2013.01); *H01L 51/5218* (2013.01); *H01L 51/5253* (2013.01); *H01L 2227/326* (2013.01); *H01L 2251/5338* (2013.01)

(58) Field of Classification Search
USPC ........................................... 257/40
See application file for complete search history.

(56) References Cited

U.S. PATENT DOCUMENTS

| | | | |
|---|---|---|---|
| 7,906,896 B2 * | 3/2011 | Seo | H01L 51/529 313/498 |
| 9,276,055 B1 * | 3/2016 | Son | H01L 27/3276 |
| 9,356,087 B1 * | 5/2016 | Lee | H01L 27/3276 |
| 9,529,217 B1 * | 12/2016 | Kim | H01L 27/1218 |
| 9,793,502 B2 * | 10/2017 | Saeki | H05K 999/99 |
| 9,977,466 B2 * | 5/2018 | Kwon | G06F 1/1652 |
| 10,074,673 B2 * | 9/2018 | Choi | H01L 27/1244 |
| 10,080,281 B2 * | 9/2018 | Jung | H01L 51/0097 |

(Continued)

FOREIGN PATENT DOCUMENTS

KR    2015-0015606 A    2/2015

OTHER PUBLICATIONS

Examination Report dated Nov. 22, 2019, issued in corresponding Indian Patent Application No. 201714038240.

*Primary Examiner* — Caleb E Henry
(74) *Attorney, Agent, or Firm* — Morgan, Lewis & Bockius LLP

(57) ABSTRACT

A display device includes a first flexible substrate; a low reflection layer on the first flexible substrate; a second flexible substrate on the low reflection layer; a thin film transistor and an organic light emitting diode on the second flexible substrate; an upper protective member configured to encapsulate the thin film transistor and the organic light emitting diode; and an electrically conductive interconnection configured to electrically connect the low reflection layer with a surface of the upper protective member.

19 Claims, 10 Drawing Sheets

(56) References Cited

U.S. PATENT DOCUMENTS

| | | | |
|---|---|---|---|
| 2013/0293816 A1* | 11/2013 | Jung | H01L 23/49827 349/139 |
| 2014/0042406 A1* | 2/2014 | Degner | H01L 27/326 257/40 |
| 2014/0049449 A1* | 2/2014 | Park | G09G 5/00 345/1.3 |
| 2014/0217373 A1* | 8/2014 | Youn | H01L 23/4985 257/40 |
| 2014/0217382 A1* | 8/2014 | Kwon | H01L 51/0097 257/40 |
| 2014/0217397 A1* | 8/2014 | Kwak | H01L 27/1218 257/43 |
| 2014/0232956 A1* | 8/2014 | Kwon | G02F 1/133305 349/12 |
| 2014/0354143 A1* | 12/2014 | Jung | H01L 51/0097 313/511 |
| 2015/0008396 A1* | 1/2015 | Naijo | H01L 51/0097 257/40 |
| 2015/0036300 A1* | 2/2015 | Park | H05K 1/147 361/749 |
| 2016/0035812 A1* | 2/2016 | Kwon | H01L 27/3276 257/40 |
| 2016/0093685 A1* | 3/2016 | Kwon | H01L 27/3276 257/40 |
| 2016/0099428 A1 | 4/2016 | Lee et al. | |

* cited by examiner

DISPLAY DEVICE WITH A FLEXIBLE SUBSTRATE

This application claims the benefit of Korean Patent Application No. 10-2016-0161543, filed in Korea on Nov. 30, 2016, which is incorporated herein by reference for all purposes as if fully set forth herein.

BACKGROUND

Technical Field

The present disclosure relates to a display device, and more particularly, to a display device with reduced reflectance of external light and reduced drive defects dye to static electricity.

Discussion of the Related Art

With the development of the information society, the demand for display devices to display images has increased. In the display device field, the large-sized cathode ray tube (CRT) has been rapidly replaced by the flat panel display (FPD) due to advantages of thin profile, low weight, and large-sized screen. Examples of the flat panel display include a liquid crystal display (LCD), a plasma display panel (PDP), an organic light emitting diode (OLED) display, and an electrophoresis display (EPD).

An OLED display includes self-emitting elements capable of emitting light by themselves and has advantages of a fast response time, a high emission efficiency, a high luminance, and a wide viewing angle. In particular, the OLED display may use a flexible plastic substrate. In addition, the OLED display has advantages of a lower driving voltage, lower power consumption, and better color tone as compared to a plasma display panel or an inorganic electroluminescent display.

The OLED display using the flexible plastic substrate, for example, a polyimide substrate, is manufactured by coating polyimide on a glass support substrate, forming components, such as a thin film transistor and an organic light emitting diode, and attaching a chip-on-film (COF) to a pad portion. Further, a process for separating the glass support substrate from the polyimide substrate is performed. Hence, the OLED display including the flexible polyimide substrate is manufactured. However, static electricity generated in the separation process of the glass support substrate remains on the polyimide substrate, resulting in a defective drive. Further, because the polyimide substrate has anisotropy on properties of polyimide, it is difficult to apply a polarizer to the polyimide substrate. However, there is a problem that visibility characteristics of a display panel are deteriorated because of a high reflectance in the absence of the polarizer.

SUMMARY

Accordingly, embodiments of the present disclosure are directed to a display device that substantially obviates one or more of the problems due to limitations and disadvantages of the related art.

An object of the present disclosure is to provide a display device with reduced reflectance of external light.

Another object of the present disclosure is to provide a display device wherein drive defects can be prevented due to reduced static electricity.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a display device comprises a first flexible substrate; a low reflection layer on the first flexible substrate; a second flexible substrate on the low reflection layer; a thin film transistor and an organic light emitting diode on the second flexible substrate; an upper protective member configured to encapsulate the thin film transistor and the organic light emitting diode; and an electrically conductive interconnection configured to electrically connect the low reflection layer with a surface of the upper protective member.

In another aspect, a display device comprises a first flexible substrate; a low reflection layer on the first flexible substrate; a second flexible substrate on the low reflection layer; a thin film transistor and an organic light emitting diode on the second flexible substrate; an upper protective member configured to encapsulate the thin film transistor and the organic light emitting diode; and a silver dot configured to electrically connect the low reflection layer with a surface of the upper protective member.

In another aspect, a display device comprises a first flexible substrate; a low reflection layer on the first flexible substrate; a second flexible substrate on the low reflection layer; a thin film transistor and an organic light emitting diode on the second flexible substrate; an upper protective member configured to encapsulate the thin film transistor and the organic light emitting diode; a back cover formed of an electrically conductive material and configured to accommodate the first flexible substrate, the low reflection layer, the second flexible substrate, the thin film transistor, the organic light emitting diode, and the upper protective member; and a silver dot configured to directly contact the low reflection layer and the back cover such that the low reflection layer is electrically connected with a surface of the upper protective member.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles. In the drawings.

DETAILED DESCRIPTION

Reference will now be made in detail to embodiments of the invention, examples of which are illustrated in the accompanying drawings. Wherever possible, the same reference numbers will be used throughout the drawings to refer to the same or like parts. Names of the respective elements used in the following explanations are selected only for convenience of writing the specification and may be thus different from those used in actual products.

A display device according to an example embodiment is a flexible display device, in which a display element is formed on a flexible substrate. Examples of the flexible display device include an organic light emitting diode (OLED) display, a liquid crystal display (LCD), and an electrophoresis display. Embodiments are described using the OLED display by way of example. An OLED display includes an organic layer formed of an organic material between a first electrode serving as an anode and a second electrode serving as a cathode. The OLED display is a self-emission display device configured to form hole-electron pairs, i.e., excitons by combining holes received from the first electrode and electrons received from the second electrode inside the organic layer and emit light by energy generated when the excitons return to a ground level.

Example embodiments are described below with reference to FIGS. 1 to 12.

Figure 1:
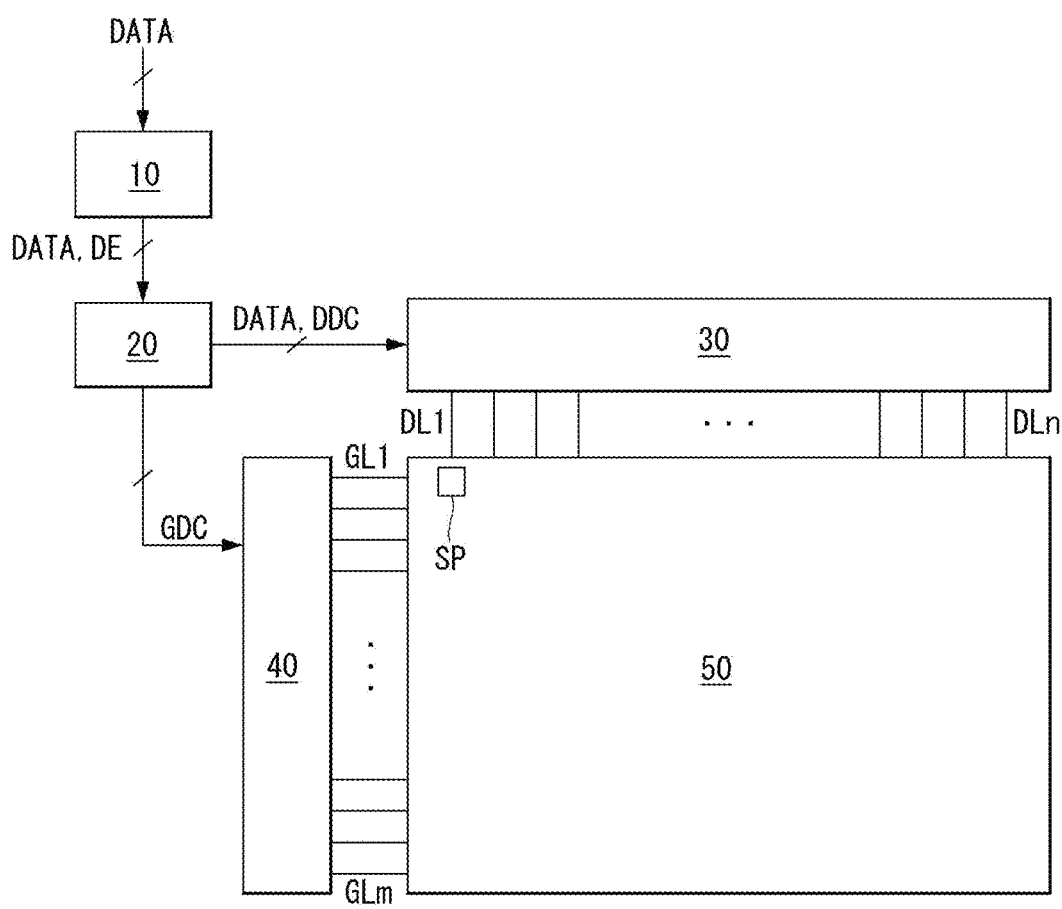
FIG. 1 is a schematic block diagram of an organic light emitting diode (OLED) display.
Figure 2:
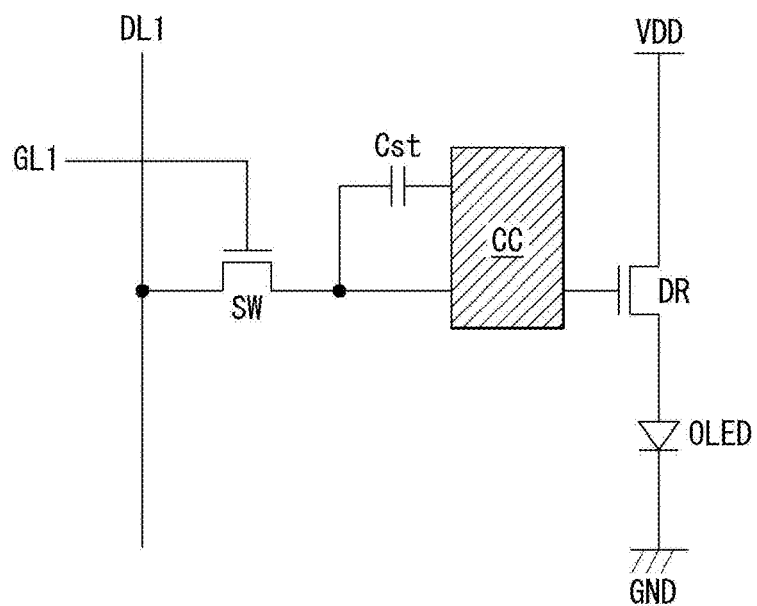
FIG. 2 is a diagram illustrating a first example of a circuit configuration of a subpixel.
Figure 3:
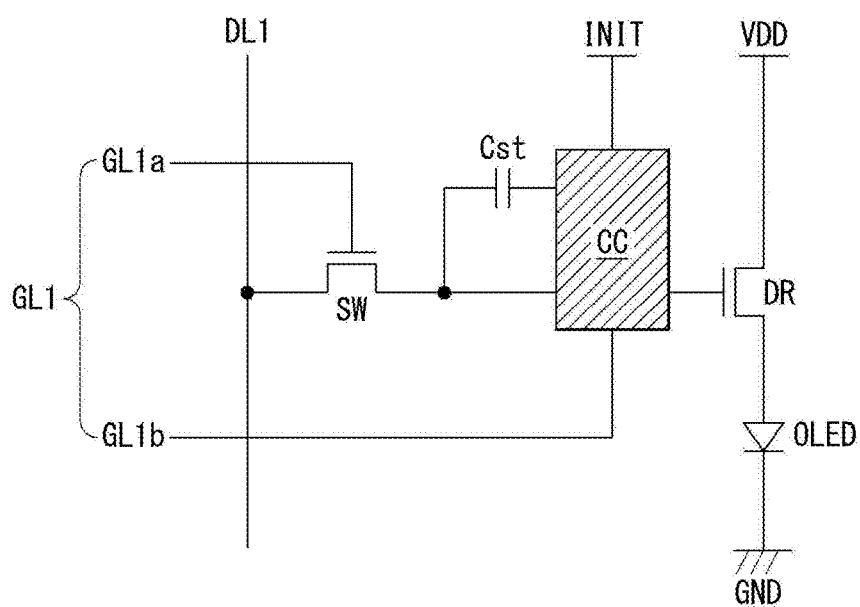
FIG. 3 is a diagram illustrating a second example of a circuit configuration of a subpixel.

FIG. 1 is a block diagram of an OLED display. FIG. 2 illustrates a first example of a circuit configuration of a subpixel. FIG. 3 illustrates a second example of a circuit configuration of a subpixel.

With reference to FIG. 1, an OLED display according to an example embodiment may include an image processing unit 10, a timing controller 20, a data driver 30, a gate driver 40, and a display panel 50. The image processing unit 10 outputs a data signal DATA and a data enable signal DE supplied from the outside. The image processing unit 10 may output one or more of a vertical sync signal, a horizontal sync signal, and a clock signal in addition to the data enable signal DE. For the sake of brevity and ease of reading, these signals are not shown. The image processing unit 10 may be formed on a system circuit board, such as an integrated circuit (IC). The timing controller 20 receives the data signal DATA and driving signals including the data enable signal DE or the vertical sync signal, the horizontal sync signal, the clock signal, etc. from the image processing unit 10. The timing controller 20 outputs a gate timing control signal GDC for controlling operation timing of the gate driver 40 and a data timing control signal DDC for controlling operation timing of the data driver 30 based on the driving signals. The timing controller 20 may be formed on a control circuit board as an IC.

The data driver 30 samples and latches the data signal DATA received from the timing controller 20 in response to the data timing control signal DDC supplied from the timing controller 20 and converts the sampled and latched data signal DATA using gamma reference voltages. The data driver 30 outputs the converted data signal DATA to data lines DL1 to DLn. The data driver 30 is attached to a substrate as an IC.

The gate driver 40 outputs a gate signal while shifting a level of a gate voltage in response to the gate timing control signal GDC supplied from the timing controller 20. The gate driver 40 outputs the gate signal to gate lines GL1 to GLm. The gate driver 40 is formed on a gate circuit board as an IC or is formed on the display panel 50 in a gate-in panel (GIP) manner.

The display panel 50 displays an image in response to the data signal DATA and the gate signal respectively received from the data driver 30 and the gate driver 40. The display panel 50 includes subpixels SP for displaying an image.

As shown in FIG. 2, each subpixel may include a switching transistor SW, a driving transistor DR, a compensation circuit CC, and an organic light emitting diode (OLED). The OLED operates to emit light based on a driving current generated by the driving transistor DR.

The switching transistor SW performs a switching operation so that a data signal supplied through a first data line DL1 is stored in a capacitor Cst as a data voltage in response to a gate signal supplied through a gate line GL1. The driving transistor DR enables a driving current to flow between a high potential power line VDD and a low potential power line GND based on the data voltage stored in the capacitor Cst. The compensation circuit CC is a circuit for compensating for a threshold voltage of the driving transistor DR. A capacitor connected to the switching transistor SW or the driving transistor DR may be mounted inside the compensation circuit CC. The compensation circuit CC includes one or more thin film transistors (TFTs) and a capacitor. The configuration of the compensation circuit CC may be varied according to a compensation method used. A brief description of the compensation circuit CC will be made.

As shown in FIG. 3, a subpixel including the compensation circuit CC may further include a signal line and a power line for driving a compensation TFT and supplying a predetermined signal or electric power. The gate line GL1 may include a 1-1 gate line GL1a supplying the gate signal to the switching transistor SW and a 1-2 gate line GL1b for driving the compensation TFT included in the subpixel. The added power line may be defined as an initialization power line INIT for initializing a predetermined node of the subpixel to a predetermined voltage. However, this is merely an example, and embodiments are not limited thereto.

FIGS. 2 and 3 illustrate that one subpixel includes the compensation circuit CC by way of example. However, the compensation circuit CC may be omitted when an object (for example, the data driver 30) to be compensated is positioned outside the subpixel. The subpixel has a configuration of 2T(Transistor)1C(Capacitor) in which the switching transistor SW, the driving transistor DR, the capacitor, and the OLED are provided. However, when the compensation circuit CC is added to the subpixel, the subpixel may have various configurations such as 3T1C, 4T2C, 5T2C, 6T2C, 7T2C, and the like. Also, FIGS. 2 and 3 illustrate that the compensation circuit CC is positioned between the switching transistor SW and the driving transistor DR by way of an example. However, the compensation circuit CC may be further positioned between the driving transistor DR and the OLED. The position and the structure of the compensation circuit CC are not limited to the ones illustrated in FIGS. 2 and 3.

First Example Embodiment

Figure 4:
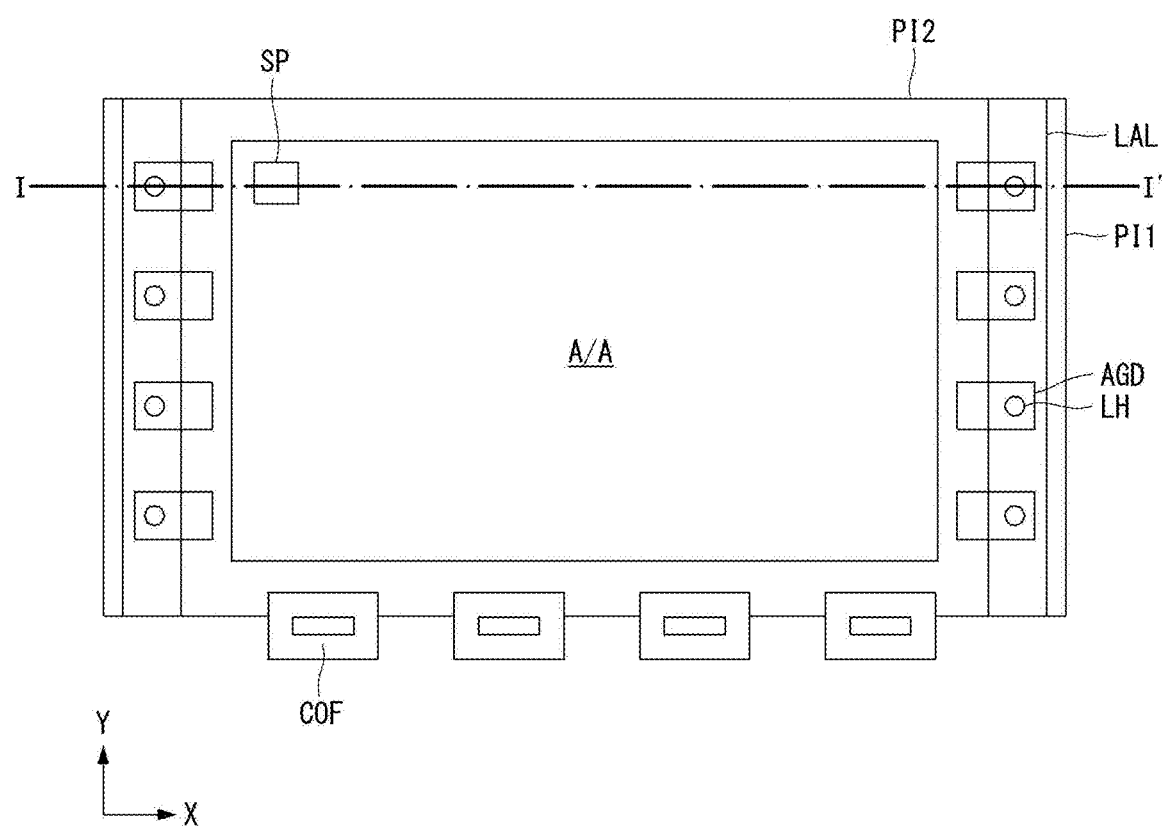
FIG. 4 is a plan view of an OLED display according to a first example embodiment.
Figure 5:
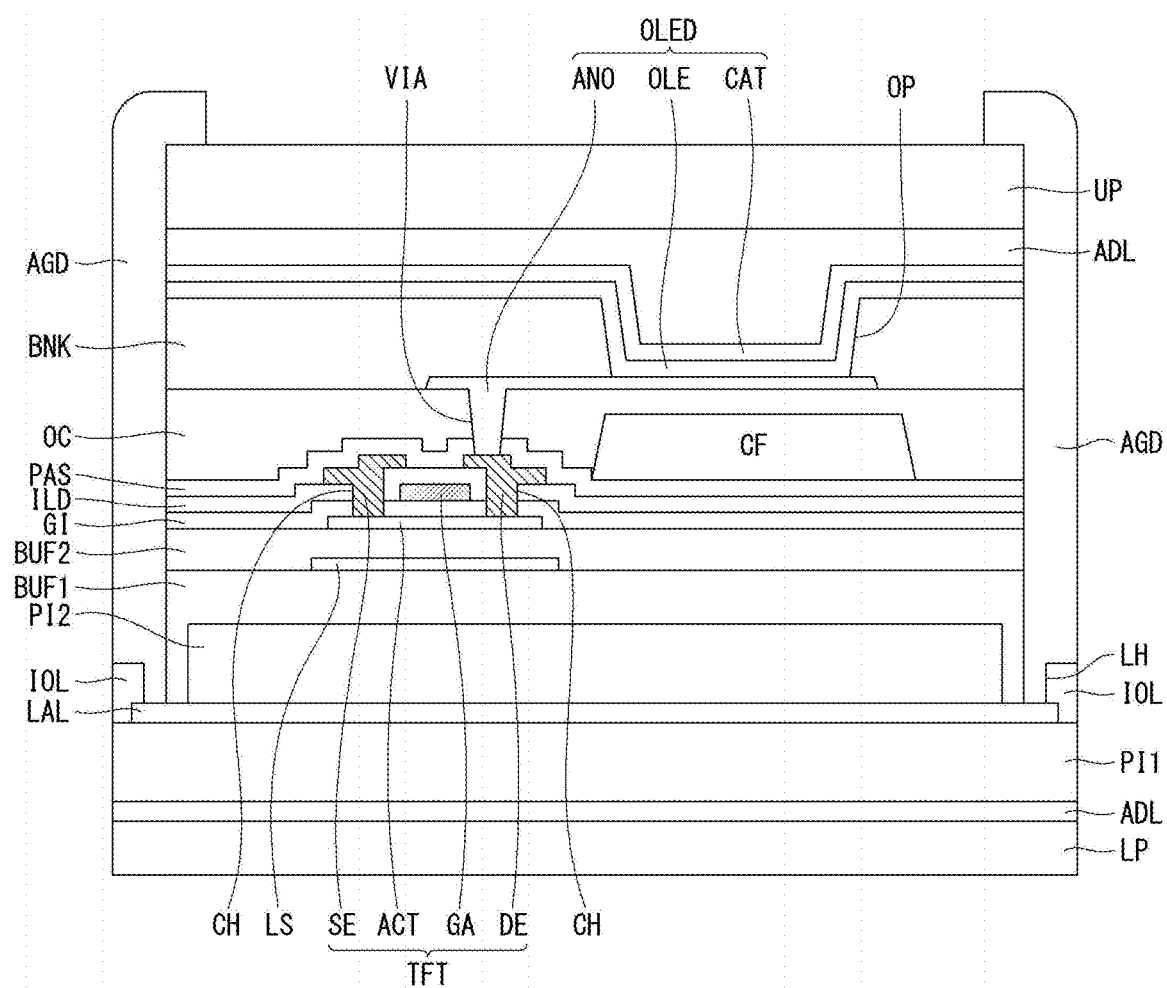
FIG. 5 is a cross-sectional view of an OLED display according to the first example embodiment.

FIG. 4 is a plan view of an OLED display according to a first example embodiment. FIG. 5 is a cross-sectional view of an OLED display according to the first example embodiment.

With reference to FIG. 4, the OLED display according to the first example embodiment includes a low reflection layer LAL interposed between a first flexible substrate PI1 and a second flexible substrate PI2, a display area A/A on the second flexible substrate PI2, and a chip-on-film (COF) disposed on a pad at the lower side of the second flexible substrate PI2 in addition to the display area A/A. The first flexible substrate PI1 and the second flexible substrate PI2 may be resin substrates having flexibility and may be respectively made of the same material or different materials. The low reflection layer LAL is disposed between the first flexible substrate PI1 and the second flexible substrate PI2. The second flexible substrate PI2 serves to reinforce the rigidity of the first flexible substrate PI1 and also insulate the low reflection layer LAL. The low reflection layer LAL serves to reduce a reflectance of light incident from the outside and discharge static electricity. The low reflection layer LAL is connected to an electrically conductive interconnection, such as a silver (Ag) dot AGD, which will be described later, through an exposure hole LH and is grounded to the outside, thereby discharging static electricity. While the electrically conductive interconnection may be configured variously, the following description with be provided with reference to the silver dot AGD as an example. A detailed description will be provided below.

The display area A/A may include a plurality of subpixels SP. For example, R (red), G (green), and B (blue) subpixels or R, G, B, and W (white) subpixels of the display area A/A may emit light to represent a full color. A GIP driver (not shown) may be disposed on one side, for example, the right side of the display area A/A and applies a gate driving signal to the display area A/A. Chip-on films COF are attached to a pad portion (not shown) disposed on one side, for example, the lower side of the display area A/A. A data signal and electric power are applied to a plurality of signal lines (not shown) connected to the display area A/A through the chip-on films COF.

A cross-sectional structure of the OLED display according to the embodiment is described below with reference to FIG. 5. The cross-sectional structure is described using one subpixel of the OLED display as an example.

With reference to FIG. 5, in the OLED display according to the embodiment, the low reflection layer LAL is disposed between the first flexible substrate PI1 and the second flexible substrate PI2. More specifically, the first flexible substrate PI1 and the second flexible substrate PI2 may be formed of a flexible resin film, for example, polyimide resin. Thus, the first flexible substrate PI1 and the second flexible substrate PI2 according to the embodiment may have flexible characteristics. The first flexible substrate PI1 and the second flexible substrate PI2 may be made of the same material or different materials. However, embodiments are not limited thereto.

The low reflection layer LAL between the first flexible substrate PI1 and the second flexible substrate PI2 serves to reduce a reflectance of light incident from the outside and discharge static electricity. In the OLED display according to the embodiment, light is emitted under the first flexible substrate PI1. Hence, the OLED display according to the embodiment can prevent external light incident through the first flexible substrate PI1 from being reflected from the low reflection layer LAL having a low reflectance. Further, the low reflection layer LAL is connected to the silver dot AGD and is grounded to the outside, thereby discharging static electricity to the outside. The low reflection layer LAL according to the embodiment may be formed of a conductive material having a low reflectance. For example, the low reflection layer LAL according to the embodiment may be formed of at least one of molybdenum (Mo), titanium (Ti), zirconium (Zr), hafnium (Hf), tantalum (Ta), chromium (Cr), tungsten (W), neodymium (Nd), iron (Fe), manganese (Mn), cobalt (Co), nickel (Ni), copper (Cu), or an alloy thereof. For example, the low reflection layer LAL according to the embodiment may be formed of molybdenum (Mo).

An area of the low reflection layer LAL may be less than an area of the first flexible substrate PI1 and may be greater than an area of the second flexible substrate PI2. As shown in FIG. 4, the first flexible substrate PI1, the second flexible substrate PI2, and the low reflection layer LAL may have the same length in a Y-axis direction of the display area A/A. Further, the first flexible substrate PI1, the second flexible substrate PI2, and the low reflection layer LAL may have different lengths in an X-axis direction of the display area A/A. For example, the first flexible substrate PI1 may be the longest in the X-axis direction, and the low reflection layer LAL may be shorter than the first flexible substrate PI1 in the X-axis direction. Further, the second flexible substrate PI2 may be shorter than the low reflection layer LAL in the X-axis direction. Thus, the low reflection layer LAL is exposed to the outside of the second flexible substrate PI2 through the exposure hole LH and, thus, may be connected to the silver dot AGD.

Accordingly, the OLED display according to the embodiment can prevent external light incident through the first flexible substrate PI1 from being reflected from the low reflection layer LAL having the low reflectance. Further, the low reflection layer LAL is connected to the silver dot AGD and is grounded to the outside, thereby discharging static electricity to the outside.

A first buffer layer BUF1 is positioned on the second flexible substrate PI2. The first buffer layer BUF1 protects a thin film transistor formed in a subsequent process from impurities, for example, alkali ions discharged from the second flexible substrate PI2. The first buffer layer BUF1 may be a silicon oxide (SiOx) layer, a silicon nitride (SiNx) layer, or a multilayer thereof.

A shield layer LS is positioned on the first buffer layer BUF1. The shield layer LS prevents a reduction in a panel driving current which may be generated by using a polyimide substrate. A second buffer BUF2 is positioned on the shield layer LS. The second buffer BUF2 protects a thin film transistor formed in a subsequent process from impurities, for example, alkali ions discharged from the shield layer LS. The second buffer layer BUF2 may be a silicon oxide (SiOx) layer, a silicon nitride (SiNx) layer, or a multilayer thereof.

A semiconductor layer ACT is positioned on the second buffer layer BUF2 and may be formed of a silicon semiconductor or an oxide semiconductor. The silicon semiconductor may include amorphous silicon or crystallized polycrystalline silicon. The polycrystalline silicon has a high mobility (for example, more than 100 cm$^2$/Vs), low power consumption, and excellent reliability. Thus, the polycrystalline silicon can be applied to a gate driver and/or a multiplexer (MUX) for use in a driving element or applied to a driving TFT of each pixel of the OLED display. Because the oxide semiconductor has a low OFF-current, the oxide semiconductor is suitable for a switching TFT which has a short ON-time and a long OFF-time. Further, because the oxide semiconductor increases a voltage hold time of the pixel due to the low OFF-current, the oxide semiconductor is suitable for a display device requiring a low-speed drive and/or low power consumption. In addition, the semiconductor layer ACT includes a drain region and a source region each including p-type or n-type impurities, and also includes a channel region between the drain region and the source region.

A gate insulating layer GI is positioned on the semiconductor layer ACT and may be a silicon oxide (SiOx) layer, a silicon nitride (SiNx) layer, or a multilayer thereof. A gate electrode GA is positioned on the gate insulating layer GI at a location corresponding to a predetermined region (i.e., the channel region when impurities are injected) of the semiconductor layer ACT. The gate electrode GA may be formed of one of molybdenum (Mo), aluminum (Al), chrome (Cr), gold (Au), titanium (Ti), nickel (Ni), neodymium (Nd), copper (Cu), or a combination thereof. Further, the gate electrode GA may be a multilayer formed of one of molybdenum (Mo), aluminum (Al), chrome (Cr), gold (Au), titanium (Ti), nickel (Ni), neodymium (Nd), copper (Cu), or a combination thereof. For example, the gate electrode GA may be formed as a double layer of Mo/Al—Nd or Mo/Al.

An interlayer dielectric layer ILD is positioned on the gate electrode GA and insulates the gate electrode GA. The interlayer dielectric layer ILD may be a silicon oxide (SiOx) layer, a silicon nitride (SiNx) layer, or a multilayer thereof. Contact holes CH exposing a portion of the semiconductor layer ACT are formed in a portion of each of the interlayer dielectric layer ILD and the gate insulating layer GI.

A drain electrode DE and a source electrode SE are positioned on the interlayer dielectric layer ILD. The drain electrode DE is connected to the semiconductor layer ACT through the contact hole CH exposing the drain region of the semiconductor layer ACT, and the source electrode SE is connected to the semiconductor layer ACT through the contact hole CH exposing the source region of the semiconductor layer ACT. Each of the source electrode SE and the drain electrode DE may be formed as a single layer or as a multilayer. When each of the source electrode SE and the drain electrode DE is formed as the single layer, each of the source electrode SE and the drain electrode DE may be formed of one of molybdenum (Mo), aluminum (Al), chrome (Cr), gold (Au), titanium (Ti), nickel (Ni), neodymium (Nd), copper (Cu), or a combination thereof. When each of the source electrode SE and the drain electrode DE is formed as the multilayer, each of the source electrode SE and the drain electrode DE may be formed as a double layer of Mo/Al—Nd or as a triple layer of Ti/Al/Ti, Mo/Al/Mo or Mo/Al—Nd/Mo. Thus, a thin film transistor TFT including the semiconductor layer ACT, the gate electrode GA, the source electrode SE, and the drain electrode DE is formed.

Further, a passivation layer PAS is positioned on the second flexible substrate PI2 including the thin film transistor TFT. The passivation layer PAS is an insulating layer protecting the component underlying the passivation layer PAS and may be a silicon oxide (SiOx) layer, a silicon nitride (SiNx) layer, or a multilayer thereof. A color filter CF is positioned on the passivation layer PAS. The color filter CF converts white light emitted by an organic light emitting diode OLED into red, green, or blue light. An overcoat layer OC is positioned on the color filter CF. The overcoat layer OC may be a planarization layer for reducing a height difference of an underlying structure and may be formed of an organic material such as polyimide, benzocyclobutene-based resin, and acrylate. For example, the overcoat layer OC may be formed through a spin-on glass (SOG) method for coating the organic material in a liquid state and then curing the organic material.

A via hole VIA exposing the drain electrode DE of the thin film transistor TFT is positioned in a portion of the overcoat layer OC. The organic light emitting diode OLED is positioned on the overcoat layer OC. More specifically, a first electrode ANO is positioned on the overcoat layer OC. The first electrode ANO serves as a pixel electrode and is connected to the drain electrode DE of the thin film transistor TFT through the via hole VIA. The first electrode ANO is an anode and may be formed of a transparent conductive material, such as indium tin oxide (ITO), indium zinc oxide (IZO), and zinc oxide (ZnO). When the first electrode ANO is a reflective electrode, the first electrode ANO may further include a reflective layer. The reflective layer may be formed of aluminum (Al), copper (Cu), silver (Ag), nickel (Ni), palladium (Pd), or a combination thereof. For example, the reflective layer may be formed of an Ag/Pd/Cu (APC) alloy.

In addition, a bank layer BNK defining pixels is positioned on the second flexible substrate PI2 including the first electrode ANO. The bank layer BNK may be formed of an organic material, such as polyimide, benzocyclobutene-based resin, and acrylate. The bank layer BNK includes a pixel definition portion exposing the first electrode ANO. An organic layer OLE contacting the first electrode ANO is positioned at a front surface of the second flexible substrate PI2. The organic layer OLE is a light emitting layer, in which electrons and holes combine and emit light. A hole injection layer and/or a hole transport layer may be positioned between the organic layer OLE and the first electrode ANO, and an electron injection layer and/or an electron transport layer may be positioned on the organic layer OLE.

A second electrode CAT is positioned on the organic layer OLE and may be positioned on an entire surface of the display area A/A (see FIG. 4). In addition, the second electrode CAT is a cathode electrode and may be formed of magnesium (Mg), calcium (Ca), aluminum (Al), silver (Ag), or a combination thereof each having a low work function. When the second electrode CAT is a transmissive electrode, the second electrode CAT may be thin enough to transmit light. Further, when the second electrode CAT is a reflective electrode, the second electrode CAT may be thick enough to reflect light.

An upper protective member UP is attached to an upper surface of the second flexible substrate PI2, on which the thin film transistor TFT and the organic light emitting diode OLED are formed, through an adhesive layer ADL. The upper protective member UP may be a transparent flexible substrate or a metal thin film. For example, the upper protective member UP may be a metal thin film in embodiments. Further, a lower protective member LP is attached to a lower surface of the flexible substrate PI through an adhesive layer ADL. Because the lower protective member LP transmits light, the lower protective member LP may be formed of a transparent plastic film.

The low reflection layer LAL is exposed to the outside of the second flexible substrate PI2 through the exposure hole LH formed in an inorganic insulating layer IOL. The inorganic insulating layer IOL may include one or more selected among the first buffer layer BUF1, the second buffer layer BUF2, the gate insulating layer GI, the interlayer dielectric layer ILD, and the passivation layer PAS. As shown in FIG. 4, the exposure hole LH may be formed in a shape of a plurality of dots on both sides of the low reflection layer LAL and may expose the low reflection layer LAL. However, the exposure hole LH may be disposed only on one side of the low reflection layer LAL, or may be formed in a line shape other than the dot shape or in various other shapes.

The silver dot AGD is disposed on the exposure hole LH and connects the low reflective layer LAL to the upper protective member UP. Thus, the silver dot AGD electrically grounds the low reflective layer LAL to the upper protective member UP made of a metal thin film. The upper protective member UP may serve as the ground, thereby discharging static electricity. The silver dots AGD may be formed in various shapes including a dot shape and a line shape depending on the shape of the exposure holes LH.

As described above, the OLED display according to the embodiment absorbs external light incident through the first flexible substrate PI1 in the low reflection layer LAL having the low reflectance, thereby reducing an amount of the external light reflected to the outside. Further, the low reflection layer LAL according to the embodiment is connected to the silver dots AGD and grounded to the upper protective member UP, thereby discharging static electricity. Hence, the low reflection layer LAL can prevent a defective drive resulting from static electricity.

Second Example Embodiment

Figure 6:
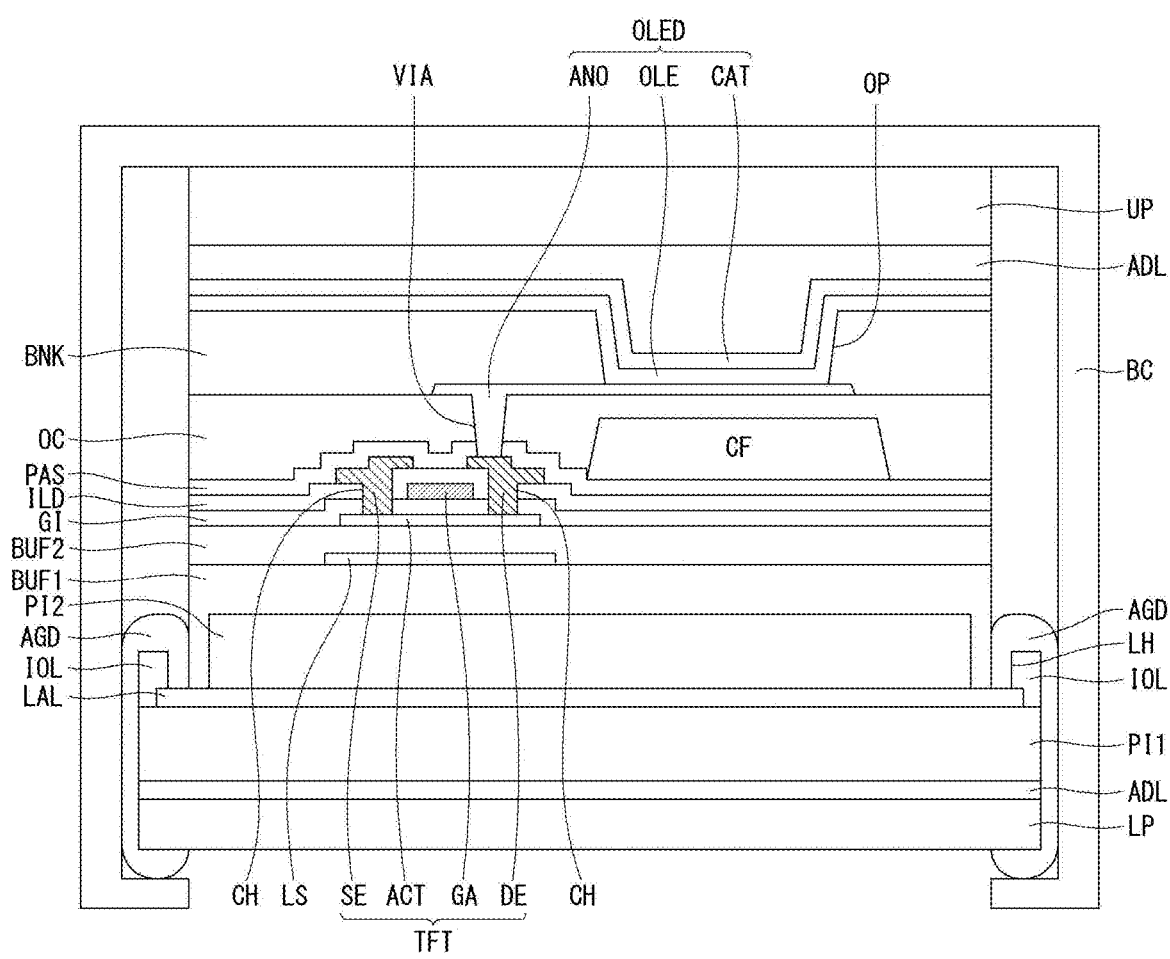
FIG. 6 is a cross-sectional view of an OLED display according to a second example embodiment.
Figure 7:
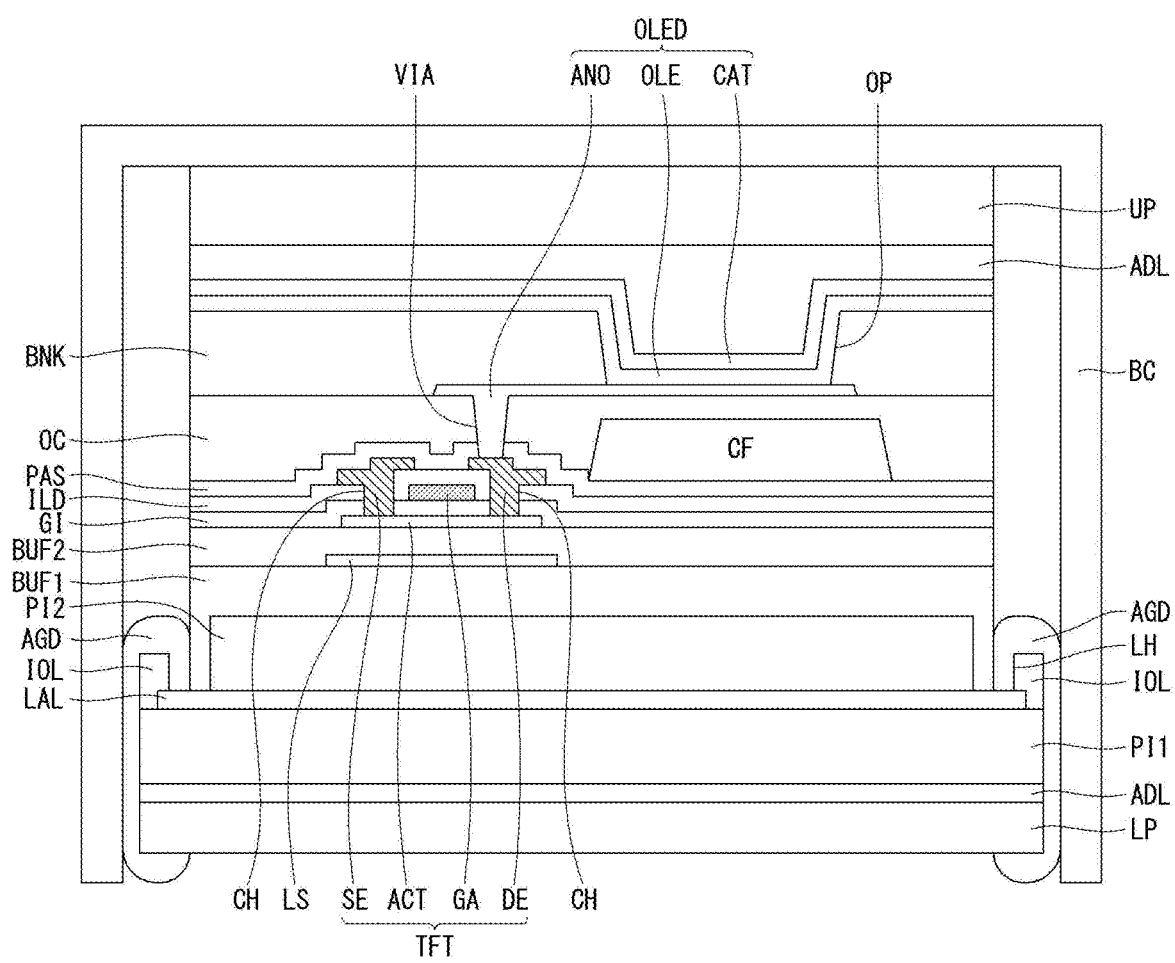
FIG. 7 is a cross-sectional view of an OLED display according to the second example embodiment.

FIG. 6 is a cross-sectional view of an OLED display according to a second example embodiment. FIG. 7 is a cross-sectional view of an OLED display according to the second example embodiment. Structures and components identical or equivalent to those illustrated in the first example embodiment are designated with the same reference numerals in the second example embodiment, and a further description may be briefly made or may be entirely omitted.

As shown in FIGS. 6 and 7, in the OLED display according to the second example embodiment, a silver dot is not connected to an upper protective member and may be connected to a back cover. More specifically, with reference to FIG. 6, the OLED display according to the second example embodiment includes a low reflection layer LAL between a first flexible substrate PI1 and a second flexible substrate PI2, and a thin film transistor TFT and an organic light emitting diode OLED on the second flexible substrate PI2. An upper protective member UP is disposed on the organic light emitting diode OLED, and a lower protective member LP is disposed under the first flexible substrate PI1.

The OLED display thus formed is accommodated in a back cover BC. The back cover BC is configured to protect and accommodate the OLED display and may be formed of a lightweight material with rigidity, for example, aluminum. In the second example embodiment, an electrically conductive interconnection, such as a silver dot AGD, connected to the low reflection layer LAL contacts the back cover BC. While the electrically conductive interconnection may be configured variously, the example embodiment will be described with reference to the silver dot AGD. The back cover BC serves as the ground and can discharge static electricity of the low reflection layer LAL as the low reflection layer LAL is grounded through the silver dot AGD. In this instance, the silver dot AGD may contact the back cover BC in a way that the silver dot AGD is formed on the low reflection layer LAL and then is accommodated in the back cover BC.

As shown in FIG. 6, the back cover BC may be configured to partially cover a lower surface of the first flexible substrate PI1. On the other hand, as shown in FIG. 7, the back cover CB may be configured to surround only the side of the first flexible substrate PI1 without covering the lower surface of the first flexible substrate PI1.

As described above, the OLED display can absorb external light incident through the first flexible substrate PI1 in the low reflection layer LAL having a low reflectance, thereby reducing an amount of the external light reflected to the outside. Further, the low reflection layer LAL may be connected to the silver dot AGD and grounded to the back cover CB, thereby discharging static electricity.

Figure 8:
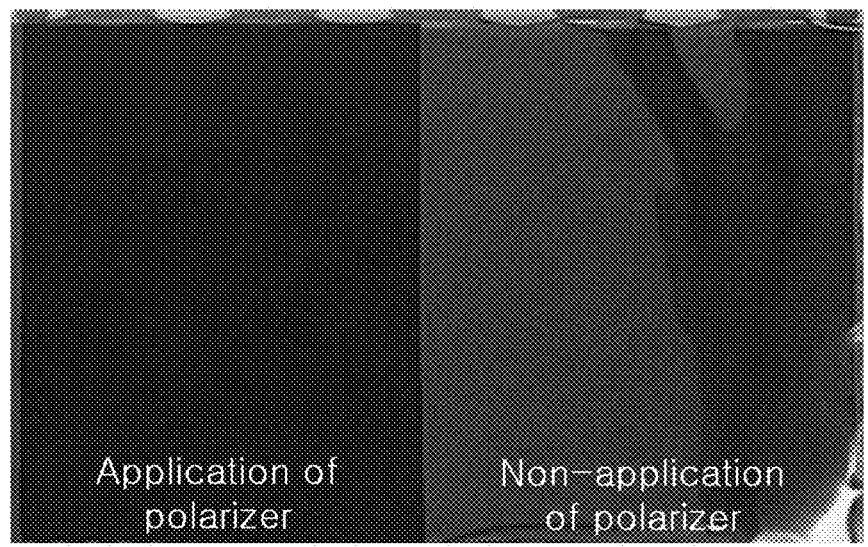
FIG. 8 illustrates an image measuring a reflectance of a display device depending on whether or not a polarizer is applied.
Figure 9:
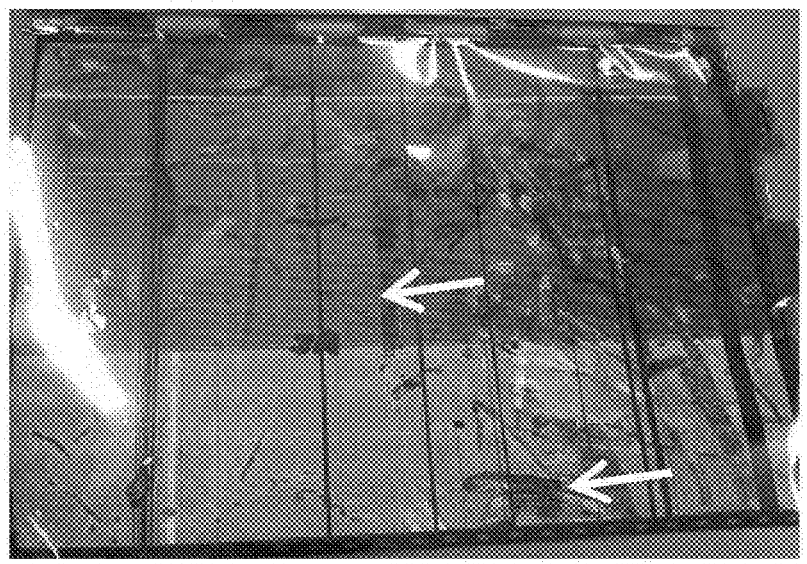
FIG. 9 illustrates an image in which a defect occurs due to static electricity of a display device.
Figure 10:
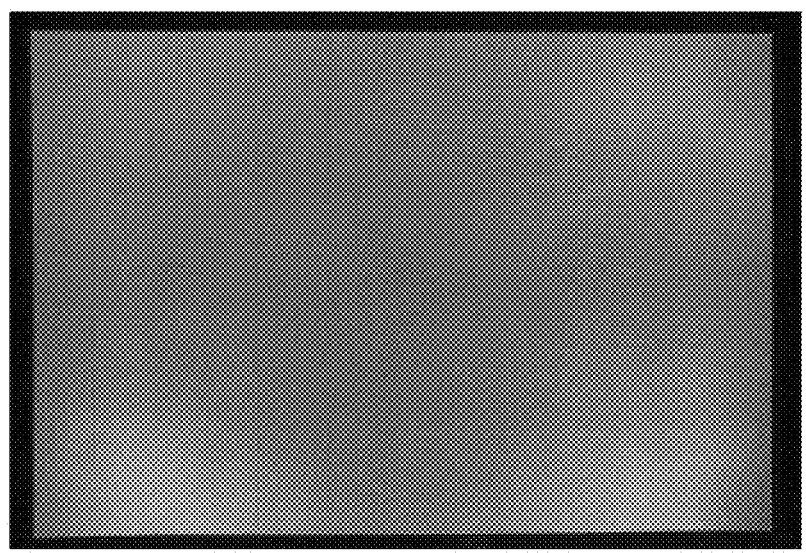
FIG. 10 illustrates an image of driving a display device according to an example embodiment.

FIG. 8 illustrates an image measuring a reflectance of a display device depending on whether or not a polarizer is applied. FIG. 9 illustrates an image in which a defect occurs due to static electricity of a display device. FIG. 10 illustrates an image of driving a display device according to an example embodiment.

With reference to FIG. 8, when a polarizer was applied to a display device, a reflectance of the display device was equal to or less than about 4.5%. On the other hand, when the polarizer was not applied to the display device, a reflectance of the display device was about 37%. It can be seen from the result of FIG. 8 that display quality of the display device was deteriorated due to the reflection of external light when the polarizer was not provided for the display device.

With reference to FIG. 9, when in a process for manufacturing a display device including a flexible substrate, static electricity generated in a process for separating a glass substrate from the flexible substrate remains on the flexible substrate, a defective drive, in which the display device cannot be normally driven, occurred even if a charged body was removed in an area contacting the charged body (for example, a finger). It can be seen from the result of FIG. 9 that static electricity existing in the flexible substrate led to the defective drive.

With reference to FIG. 10, in the OLED display illustrated in FIG. 5 that is configured such that the low reflection layer is disposed between the first and second flexible substrates and is grounded through the silver dots, static electricity generated in the process for separating the glass substrate from the flexible substrate was discharged through the ground. As a result, the defective drive was not generated.

It can be seen from the results of FIGS. 9 and 10 that embodiments can discharge static electricity generated in the flexible substrate through the low reflection layer, thereby preventing the defective drive.

Figure 11:
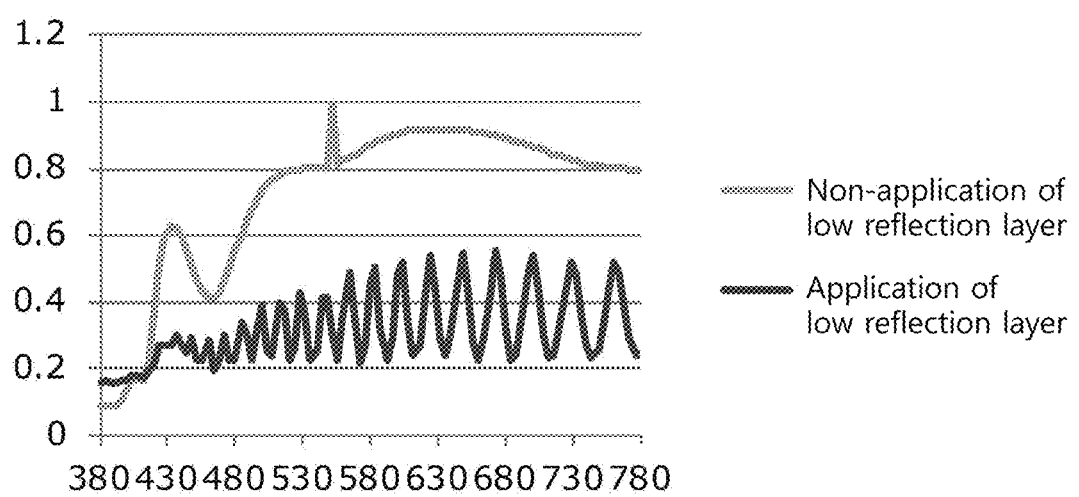
FIG. 11 is a graph illustrating a reflectance of a white pixel depending on whether or not a low reflection layer according to an example embodiment is applied.
Figure 12:
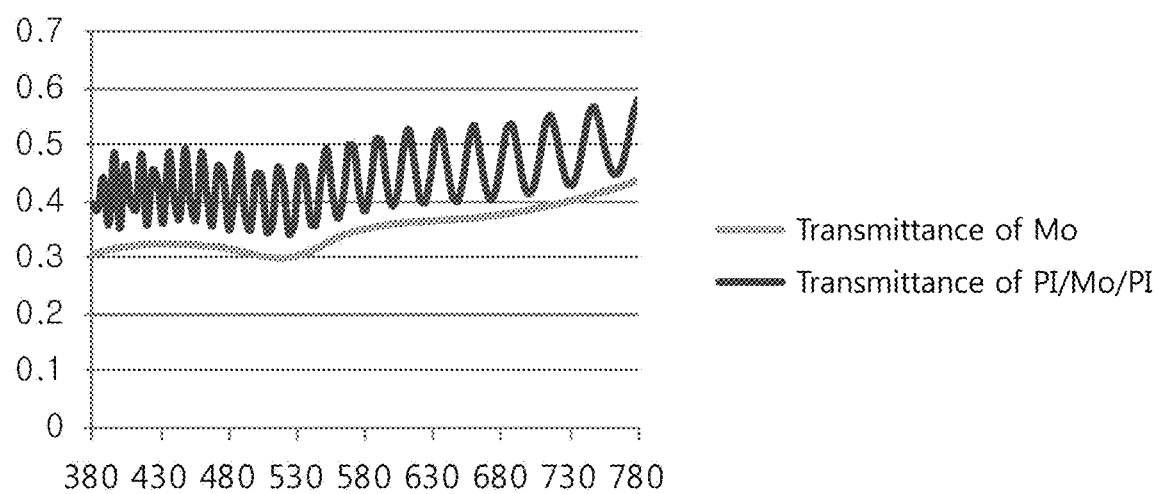
FIG. 12 is a graph illustrating a light transmittance of a molybdenum (Mo) single layer and a light transmittance of a PI/Mo/PI multilayer.

FIG. 11 is a graph illustrating a reflectance of a white pixel depending on whether or not a low reflection layer according to an example embodiment is applied. FIG. 12 is a graph illustrating a light transmittance of a molybdenum (Mo) single layer and a light transmittance of a PI/Mo/PI multilayer.

With reference to FIG. 11, when a low reflection layer according to embodiments was not applied, an average reflectance of a white pixel of a display device was about 72%. On the other hand, when the low reflection layer according to the embodiments was applied, an average reflectance of a white pixel of a display device was about 32%.

It can be seen from the result of FIG. 11 that the average reflectance when the low reflection layer according to the embodiments was applied was reduced by about 40% or more.

With reference to FIG. 12, a light transmittance of a molybdenum (Mo) single layer was about 35%. On the other hand, a light transmittance of a PI/Mo/PI multilayer, in which a molybdenum layer was disposed between the first and second flexible substrates (indicated by "PI" in FIG. 12) according to the embodiments, was about 44%.

It can be seen from the result of FIG. 12 that even when the molybdenum layer (i.e., the low reflection layer) was disposed between the first and second flexible substrates, the light transmittance was not greatly reduced. As a result, the molybdenum layer (i.e., the low reflection layer) may be applied.

As described above, the OLED display according to example embodiments absorbs external light incident through the first flexible substrate in the low reflection layer having the low reflectance, thereby reducing an amount of the external light reflected to the outside. Further, the low reflection layer according to example embodiments is connected to the silver dots and grounded to the upper protective member or the back cover, thereby discharging static electricity. Hence, the low reflection layer can prevent a defective drive resulting from static electricity.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:
a first flexible substrate;
a low reflection layer on the first flexible substrate;
a second flexible substrate on the low reflection layer;
a thin film transistor and an organic light emitting diode on the second flexible substrate;
an upper protective member configured to encapsulate the thin film transistor and the organic light emitting diode; and
an electrically conductive interconnection configured to electrically connect the low reflection layer with a surface of the upper protective member,
wherein the low reflection layer is provided between the first flexible substrate and the second flexible substrate, and the low reflection layer is formed of a conductive material, and
wherein the low reflection layer is exposed through at least one exposure hole disposed in an inorganic insulating layer.

2. The display device of claim 1, wherein the electrically conductive interconnection includes a silver dot electrically connecting the low reflection layer with the surface of the upper protective member.

3. The display device of claim 1, wherein the electrically conductive interconnection directly contacts each of the low reflection layer and the upper protective member.

4. The display device of claim 1, further comprising a back cover configured to accommodate the first flexible substrate, the low reflection layer, the second flexible substrate, the thin film transistor, the organic light emitting diode, and the upper protective member, wherein the back cover directly contacts the electrically conductive interconnection and the back cover directly contacts the upper protective member to electrically connect the low reflection layer with a surface of the upper protective member.

5. The display device of claim 1, wherein an area occupied by the low reflection layer is less than a surface area of the first flexible substrate and is greater than a surface area of the second flexible substrate.

6. The display device of claim 1, wherein the low reflection layer is formed of at least one of molybdenum (Mo), titanium (Ti), zirconium (Zr), hafnium (Hf), tantalum (Ta), chromium (Cr), tungsten (W), neodymium (Nd), iron (Fe), manganese (Mn), cobalt (Co), nickel (Ni), copper (Cu), or an alloy thereof.

7. The display device of claim 1, wherein the electrically conductive interconnection includes a silver dot filled in the exposure hole in direct contact with the low reflection layer.

8. The display device of claim 1, wherein the upper protective member includes a metal thin film.

9. A display device, comprising:
a first flexible substrate;
a low reflection layer on the first flexible substrate;
a second flexible substrate on the low reflection layer;
a thin film transistor and an organic light emitting diode on the second flexible substrate;
an upper protective member configured to encapsulate the thin film transistor and the organic light emitting diode; and
an electrically conductive interconnection configured to electrically connect the low reflection layer with a surface of the upper protective member,
wherein the low reflection layer is between the first flexible substrate and the second flexible substrate, the low reflection layer is formed of a conductive material,
wherein the low reflection layer is exposed through at least one exposure hole disposed in an inorganic insulating layer on the second flexible substrate, and
wherein the low reflection layer is exposed outside at least one side of the second flexible substrate.

10. A display device, comprising:
a first flexible substrate;
a low reflection layer on the first flexible substrate;
a second flexible substrate on the low reflection layer;
a thin film transistor and an organic light emitting diode on the second flexible substrate;
an upper protective member configured to encapsulate the thin film transistor and the organic light emitting diode; and
a silver dot configured to electrically connect the low reflection layer with a surface of the upper protective member,
wherein the low reflection layer is provided between the first flexible substrate and the second flexible substrate, and the low reflection layer is formed of a conductive material, and
wherein the low reflection layer is exposed through at least one exposure hole disposed in an inorganic insulating layer.

11. The display device of claim 10, wherein an area of the low reflection layer is less than an area of the first flexible substrate and is greater than an area of the second flexible substrate, and wherein the low reflection layer is exposed outside at least one side of the second flexible substrate.

12. A display device, comprising:
a first flexible substrate;
a low reflection layer on the first flexible substrate;
a second flexible substrate on the low reflection layer;
a thin film transistor and an organic light emitting diode on the second flexible substrate;

an upper protective member configured to encapsulate the thin film transistor and the organic light emitting diode;

a back cover formed of an electrically conductive material and configured to accommodate the first flexible substrate, the low reflection layer, the second flexible substrate, the thin film transistor, the organic light emitting diode, and the upper protective member; and a silver dot configured to directly contact the low reflection layer and the back cover such that the low reflection layer is electrically connected with a surface of the upper protective member, wherein the low reflection layer is provided between the first flexible substrate and the second flexible substrate, and the low reflection layer is formed of a conductive material.

13. The display device of claim 12, wherein an area of the low reflection layer is less than an area of the first flexible substrate and is greater than an area of the second flexible substrate.

14. The display device of claim 13, wherein the low reflection layer is exposed outside at least one side of the second flexible substrate.

15. The display device of claim 12, wherein the low reflection layer is formed of at least one of molybdenum (Mo), titanium (Ti), zirconium (Zr), hafnium (Hf), tantalum (Ta), chromium (Cr), tungsten (W), neodymium (Nd), iron (Fe), manganese (Mn), cobalt (Co), nickel (Ni), copper (Cu), or an alloy thereof.

16. The display device of claim 12, wherein the low reflection layer is exposed through at least one exposure hole disposed in an inorganic insulating layer.

17. The display device of claim 16, wherein the silver dot is filled in the exposure hole and directly contacts the low reflection layer.

18. The display device of claim 12, further comprising a lower protective member attached to a lower surface of the first flexible substrate through an adhesive layer.

19. The display device of claim 18, wherein the back cover surrounds at least one side of the lower protective member.

* * * * *